HIGH CURRENT GAIN SEMICONDUCTOR DEVICE

Filed April 21, 1950 2 Sheets-Sheet 1

INVENTOR
Bernard N. Slade
BY H. O. Newton
ATTORNEY

Jan. 19, 1954 B. N. SLADE 2,666,873

HIGH CURRENT GAIN SEMICONDUCTOR DEVICE

Filed April 21, 1950 2 Sheets-Sheet 2

INVENTOR
Bernard N. Slade
BY H. O. Newton
ATTORNEY

Patented Jan. 19, 1954 2,666,873

UNITED STATES PATENT OFFICE 2,666,873

HIGH CURRENT GAIN SEMICONDUCTOR DEVICE

Bernard N. Slade, Morristown, N. J., assignor to Radio Corporation of America, a corporation of Delaware Application April 21, 1950, Serial No. 157,246

18 Claims. (Cl. 317—235)

This invention relates generally to semi-conductor devices, and particularly relates to a semi-conductor amplifier, oscillator or the like having improved electrical characteristics and to a method of preparing such a device.

A semi-conductor device suitable as an amplifier or oscillator comprises a semi-conducting body and a base electrode, an emitter electrode and a collector electrode in contact with the body. The base electrode is usually a large-area electrode and is in low-resistance, non-rectifying contact with the semi-conducting body which may, for example, be a germanium crystal. The emitter and collector electrodes are usually small-area electrodes which are in rectifying, high-resistance contact with the crystal. For operation as an amplifier, for example, a voltage is impressed between collector and base electrodes in the reverse direction while a voltage in the forward direction is impressed between the emitter and base electrodes. Assuming an N type crystal, a negative potential is required on the collector with respect to the base electrode and a positive potential on the emitter with respect to the base electrode. If a P type crystal is used the potentials must be reversed. Devices of the above character are usually known as transistors.

It has previously been assumed as evidenced by the published literature that the distance between emitter and collector electrodes is critical and should be approximately two mils or even less. This was due to experimental evidence indicating that the gain decreases as the distance between the rectifying electrodes increases. Thus, the current gain of the device decreases in accordance with an exponential law so that it is rapidly reduced to less than unity as the distance is increased. The small spacing between emitter and collector electrodes causes undesired interaction between the input and output circuits. Thus, when the device is used as an amplifier, the amplifier becomes unstable and frequently develops a distorted output signal.

This instability of the device is due to internal feedback which is believed to be caused by a large value of the equivalent base resistance. The equivalent base resistance may be defined as the partial differential quotient of the emitter voltage with respect to the collector current while the emitter current is maintained constant. This equivalent base resistance may be as high as several hundred ohms. It is believed that the equivalent base resistance preferably should be approximately 50 ohms or less to provide a semi-conductor device having less internal feedback. Such a device is less apt to oscillate in an amplifier circuit, causes less distortion and is generally more stable.

The current gain of the improved semi-conductor device of the invention is considerably higher than that of previously known devices which is approximately between 1 and 3. By increasing the current gain of the device the power gain may be maintained high even though the equivalent output resistance is decreased. The equivalent output resistance of the device is essentially the resistance measured when looking into the collector electrode.

It is accordingly the principal object of the present invention to provide an improved semi-conductor device having superior electrical characteristics, suitable as an amplifier, oscillator or the like, and to provide an improved method of preparing such a device.

A further object of the invention is to provide a device of the type referred to, having a lower equivalent base resistance and lower internal feedback than previously known transistor devices, whereby the device of the invention may be utilized, for example, in an amplifier circuit which will be more stable and less liable to oscillate.

Another object of the invention is to provide a semi-conductor device having a higher current gain than previously known transistor devices, whereby the power gain of the device is comparable to that of prior art devices while the equivalent output resistance is reduced to levels heretofore unattainable without reduction of power gain.

A still further object of the invention is to provide a semi-conductor device which combines a desired high frequency response with a high current gain, a high power gain and low internal feedback.

In accordance with the present invention, a semi-conductor device is electrically treated by impressing an electrical charge between collector and base electrodes in the reverse direction while a steady current is permitted to flow between the emitter, collector and base electrodes. This electrical treatment may be called pulsing, and may be effected by discharging a previously charged capacitor between collector and base electrodes. Further, in accordance with the present invention, the pulsing takes place while the emitter and collector electrodes are relatively widely spaced and no less than 10 mils and preferably approximately 15 mils apart.

If the semi-conducting crystal has a high bulk resistivity which will be defined hereinafter, such a pulsed device is now ready for use. It has an equivalent base resistance of less than 100 ohms and preferably of less than 50 ohms.

Alternatively, it is feasible to utilize a crystal having a low bulk resistivity. In that case, pulsing takes place in the manner previously described. However, after the pulsing has been effected, the emitter electrode may be moved toward the collector electrode so that their distance is no more than 5 mils. Alternatively, pulsing may take place while an auxiliary or pulsing electrode spaced from the collector electrode by not less than 10 mils, is connected in the circuit. After the pulsing has been finished, the auxiliary electrode is disconnected and an emitter electrode is utilized which is spaced from the collector electrode by no more than 5 mils.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 4:
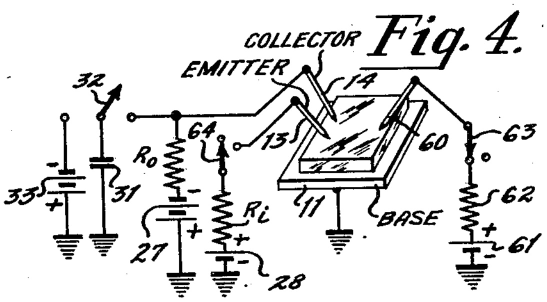
Figure 5:
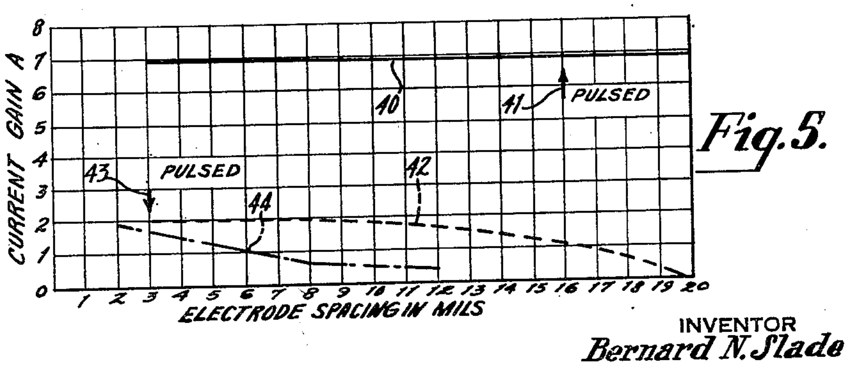
Figure 6:
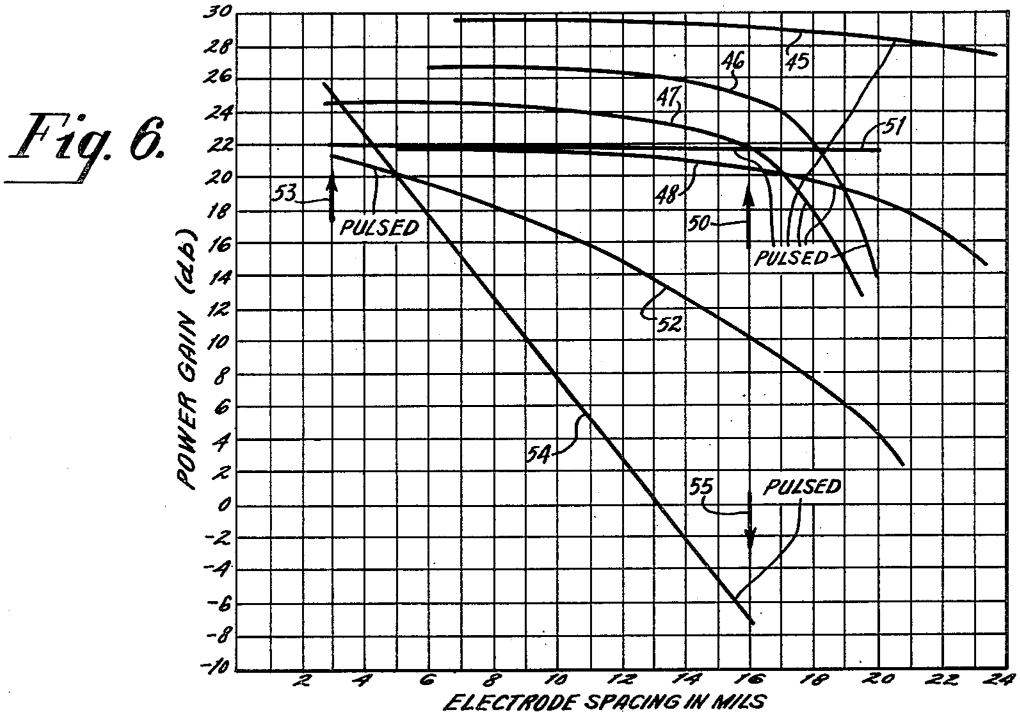
Figure 7:
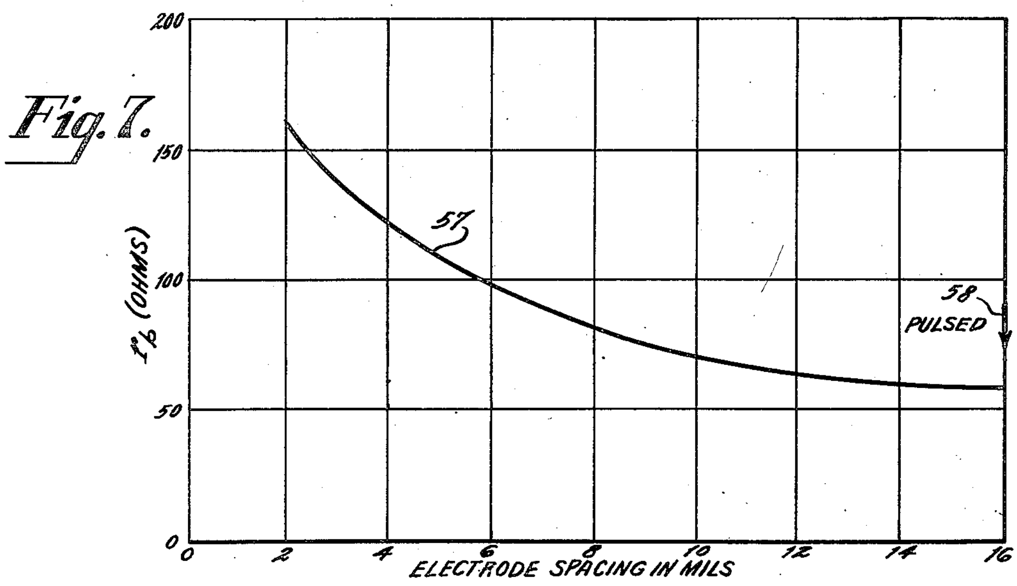

Figure 4 is a schematic circuit diagram of a modified semi-conductor device and operating system therefor embodying the invention; and Figures 5 to 7 are graphs showing, respectively, curves of the current gain, the power gain and the equivalent base resistance plotted with respect to the spacing of the emitter and collector electrodes of various semi-conductor devices in accordance with the present invention and of prior art devices for purposes of comparison.

Figure 1:
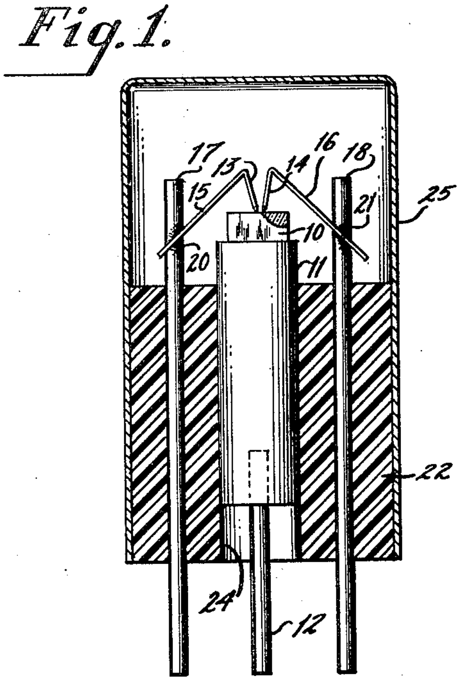
Figure 1 is an elevational view, partly in section, of a semi-conductor device of the type to which the invention relates.

Referring now to Figure 1 there is illustrated a semi-conductor device of the type disclosed and claimed in a copending application to George M. Rose, Jr., Serial No. 90,702, filed April 30, 1949, entitled "Semi-Conductor Amplifier Construction" and assigned to the assignee of this application (now Patent 2,538,593, issued January 16, 1951). The device of Figure 1 includes a block 10 of semi-conducting material. The block 10 may, for example, consist of a crystal of boron, silicon, germanium, selenium or tellurium containing a small but sufficient number of atomic impurity centers or lattice imperfections as commonly employed for best results in crystal rectifiers. Germanium is the preferred material for the block 10 and may be prepared so as to be an electronic N type semi-conductor as is well known. The surface of block 10 may be polished and etched as is conventional.

The block 10 is soldered or sweated to a bar 11 which may, for example, consist of brass or any other suitable electric conductor. Bar 11 accordingly represents the base electrode of the device which is in low-resistance, non-rectifying contact with body 10. Bar 11 may have a square cross-section or a circular cross section, as shown. A stiff wire or pin 12 of conducting material such as a heavy nickel wire is soldered or otherwise secured to the bar 11 to provide electrical contact with the block 10. Semi-conducting block 10, bar 11 and pin 12 forms the first sub-assembly of the complete device.

Rectifying electrodes 13 and 14 which represent the emitter and collector electrodes respectively, consist each of a fine, stiff, resilient filament or wire having pointed ends 15, 16. Wires 13 and 14 may consist, for example, of Phosphor bronze and may have a diameter of between 3 and 10 mils. Electrodes 13 and 14 are in high-resistance, rectifying contact with body 10.

Wires 13 and 14 are welded to supports 17 and 18 as shown at 20, 21. Supports 17 and 18 may also consist of a heavy nickel wire imbedded in and extending through insulating cylindrical body 22 which may consist, for example, of a suitable plastic material such as Bakelite, Cibanite or Durez. Supports 17 and 18 are preferably molded into cylinder 22. Cylinder 22 is provided with a central cylindrical aperture 24 through which bar 11 may be pressed. The dimensions of aperture 24 and of bar 11 are such that the bar has a press fit with cylinder 22. Preferably, pin 12 and supports 17, 18 are arranged in a common plane and extend beyond the bottom of cylinder 22 to form pins which fit a standard subminiature tube socket.

Cylinder 22, supports 17, 18 and wires 13, 14 form the second sub-assembly of the complete device. The device preferably is enclosed by housing 25 which may have a cup-shape as shown. Housing 25 may consist of a plastic material or of nickel-plated cold-rolled steel. Housing 25 forms the third sub-assembly of the complete device and may have a press fit with cylinder 22. Housing 25 has the purpose of protecting the semi-conducting block 10 and its point contacts from mechanical damage and from the deleterious action of the air and chemicals contained therein.

As has been more fully explained in the Rose application above referred to, wires 13 and 14 are formed with a bend intermediate their ends which forms an acute angle with their substantially straight end portions. By virtue of this construction the spacing between the pointed tips of wires 13, 14 will remain substantially constant when bar 11 is pushed upwards against the wires.

In accordance with the present invention, a semi-conductor device of the type illustrated in Figure 1 is electrically treated under certain conditions, thereby to provide a device with improved electrical characteristics. The forming of the device may be carried out with the circuit shown diagrammatically in Figure 2. The device again includes block 10 which may consist of an N type germanium crystal provided with base electrode 11, emitter electrode 13 and collector electrode 14. Battery 27 has its positive terminal connected to base electrode 11 while its negative terminal is connected to collector electrode 14 through resistor $R_0$. Another battery 28 has its negative terminal connected to base electrode 11 while its positive terminal is connected to emitter electrode 13 through resistor $R_1$. A milliammeter indicated at 30 may be included in the emitter circuit for measuring the emitter current. Accordingly, collector electrode 14 is biased with respect to base electrode 11 in the reverse direction while emitter electrode 13 is biased with respect to base electrode 11 in the forward direction.

Capacitor 31 which may be adjustable as shown, has one terminal connected to base electrode 11. Its other terminal may be connected by single-pole double-throw switch 32 across battery 33 which has its positive terminal connected to base electrode 11. Alternatively, capacitor 31 may be connected by switch 32 between collector electrode 14 and base electrode 11.

Figure 2:
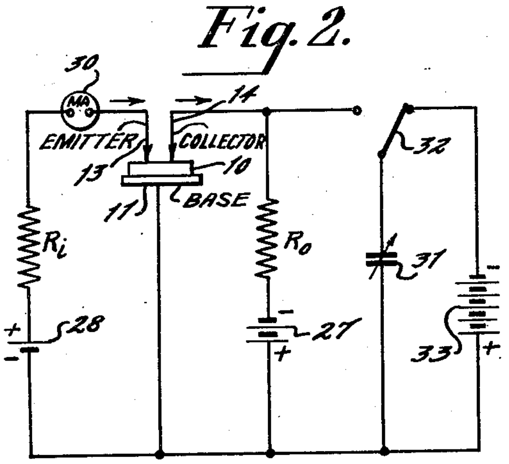
Figure 2 is a schematic circuit diagram for a semi-conductor device of the type shown in Figure 1, arranged for operation in accordance with the invention.

The device of Figure 2 preferably consists of a germanium body 10 having a high bulk resistivity. Furthermore, the N type impurity content of body 10 should be low. A material having a high bulk resistivity as referred to hereinafter is defined by a resistivity of between approximately 10 and 20 ohm-centimeter.

Figure 3:
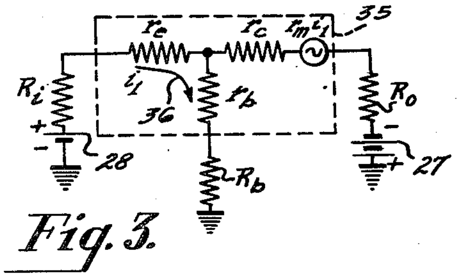
Figure 3 is an equivalent schematic circuit diagram of a semi-conductor amplifier in accordance with the invention, the device being represented as a T network.

For a better understanding of the invention, reference is now made to Figure 3 which illustrates the equivalent circuit diagram of the semi-conductor amplifier. The T network enclosed within dotted box 35 schematically represents the device. The external input and output resistors $R_i$ and $R_0$ have been shown in Figure 3 as well as batteries 27 and 28. $R_b$ indicates the external base resistance. The T network consists of a vertical branch consisting of resistor $r_b$ and of a horizontal branch including resistors $r_e$ and $r_c$, to the junction point of which $r_b$ is connected. An impedanceless generator is also indicated in Figure 3 comprising the product of $r_m$ and $i_1$, where $i_1$ indicates a current flowing in the direction shown by arrow 36.

For the following discussion it is desirable to introduce the following symbols. Thus, $R_{11}=r_e+r_b$; $R_{21}=r_m$; $R_{12}=r_b$ and $R_{22}=r_c+r_b$. $R_{11}$ is the equivalent emitter resistance, $R_{21}$ is the transfer resistance, $R_{12}$ is the equivalent base resistance and $R_{22}$ is the equivalent collector resistance. Since $r_b$ is normally small against $r_c$, $R_{22}$ is approximately equal to $r_c$.

The current gain A may be defined as follows: $A=R_{21}/R_{22}$. Accordingly, A is a dimensionless number. The equivalent base resistance $r_b$ may be defined by the partial differential quotient of the emitter voltage with respect to the collector current while the emitter current is maintained constant. For a further explanation of the equivalent emitter and collector resistances and of the transfer resistance, reference is made to a paper by J. Bardeen and W. H. Brattain which appears on pages 239 to 277 of the April 1949 issue of "Bell System Technical Journal" and which is entitled "Physical Principals Involved in Transistor Action" (see particularly pages 249 to 251). The power gain of a semi-conductor device may be defined as follows: $G=A^2R_{22}/4R_{11}$.

Referring now again to the circuit of Figure 2, body 10 should consist, as previously pointed out, of a high bulk resistivity material for the device disclosed in Figure 2. Furthermore, in accordance with the present invention, the distance between emitter electrode 13 and collector electrode 14 should be no less than 10 mils for the electrical treatment. Preferably, this distance should be approximately 15 mils. When the two rectifying electrodes are thus spaced, the device is ready for the electrical treatment. To this end, batteries 27 and 28 are connected as shown in Figure 2 so that steady currents will flow through all three electrodes 11, 13 and 14. The collector current $I_c$ will be between .5 and 2 ma. The emitter current $I_e$ may normally be between .2 and 2 ma. before pulsing. During pulsing $I_e$ should be adjusted to a value between 2 and 4 ma. The voltage of battery 28 should be between .1 and 2 volts. The voltage of battery 27 should be between 20 and 50 volts. The voltage of battery 33 should be approximately 180 volts. The capacitance of capacitor 31 should be between .001 and .2 microfarad and preferably between .03 and .10 microfarad.

Electrical treatment or pulsing is now effected by throwing switch 32 to discharge the previously charged capacitor 31 across collector electrode 14 and base electrode 11. It will be seen that the electrical charge will be applied in the reverse direction. The electrical charge which is thus applied may vary between 1.8 and 36 microcoulomb and preferably between 5.4 and 18 microcoulomb. After pulsing, the emitter current will have approximately the same values as before pulsing, that is, between .2 and 2 ma., while the collector current $I_c$ increases to between 2.5 and 4 ma. The device, thus treated, is now ready for use and may have the form shown in Figure 1.

The unusual electrical characteristics of the device of the invention described in connection with Figure 2 will now be explained. To this end, reference is now had to Figure 5 which shows the current gain A plotted with respect to the spacing in mils between emitter electrode 13 and collector electrode 14. Curve 40 shows the current gain of a device treated as explained in connection with Figure 2 and pulsed at a spacing between the rectifying electrodes of 16 mils as indicated by arrow 41. It will be seen that the current gain remains substantially constant for electrode spacing between 3 and 20 mils. Dotted curve 42 illustrates the current gain for the same germanium crystal. In this case, however, the device has been pulsed with a spacing between emitter electrode 13 and collector electrode 14 of 3 mils as indicated by arrow 43. It will be observed that the current gain is considerably lower, that is, approximately 2, and falls off rapidly as the spacing between the electrodes is increased above 12 mils. It should be noted that the collector electrode 14 remains fixed while emitter electrode 13 is moved to obtain curves 40 and 42.

For purposes of comparison, curve 44 is shown in Figure 5, which illustrates the current gain as shown in Figure 5 of the paper by Bardeen and Brattain, above referred to. It is stated in this paper that the measurements were made with formed collector points. However, it is not clear at which electrode spacing the forming was performed. In accordance with curve 44, the current gain drops below unity when the electrode spacing becomes larger than 6 mils. It will also be observed that the current gain of curve 40 is over three times as large as the initial current gain shown by curves 42 and 44.

Figure 6 illustrates various curves showing the power gain in decibels (db) with respect to the electrode spacing in mils. Curves 45, 46, 47 and 48 show the power gain for four different devices made with different germanium crystals. The devices were pulsed with a spacing between emitter and collector electrodes of 16 mils as indicated by arrow 50. After pulsing, the emitter electrode was moved to obtain the power gain at different electrode spacings. It will be noted that the power gain is very high and remains almost constant until the spacing between emitter and collector electrodes exceeds 16 mils.

Curves 51 and 52 show the effect of pulsing with different electrode spacing on the power gain for the same germanium crystal. Curve 51 was obtained in the manner previously explained and pulsing was effected with a distance between the rectifying electrodes of 16 mils. Curve 52 was obtained by pulsing the same device with a spacing of the rectifying electrodes of three mils as shown by arrow 53. Curve 52 clearly shows the enormous decrease of the power gain with an increase of the spacing between the rectifying electrodes for this electrical treatment. Since curves 51 and 52 were obtained with the same crystal all other factors which might change the shape of the curves, were eliminated.

As explained hereinabove, the device of the invention when pulsed as shown in connection with Figure 2 should be made of a semi-conducting material having a high bulk resistivity. Curve 54 of Figure 6 shows the relationship between the power gain and the electrode spacing when a germanium crystal with low bulk resistivity is pulsed with an electrode spacing of 16 mils as shown by arrow 55. At the present time, no explanation can be given for this phenomena. A low bulk resistivity material as referred to hereinafter is defined as a material having a resistivity of less than 10 ohm-centimeter and preferably having a resistivity of between approximately 2 and 8 ohm-centimeter.

Curve 57 of Figure 7 shows the equivalent base resistance $r_b$ with varying electrode spacing. The device was pulsed with a spacing of the rectifying electrodes of 16 mils as indicated by arrow 58. Curve 57 shows that $r_b$ does not decrease substantially when the spacing between the rectifying electrodes is approximately 10 mils or more. Accordingly, the emitter and collector electrodes of the device described in connection with Figure 2 should be spaced at least 10 mils apart. If the spacing increases beyond this figure, $r_b$ remains substantially constant; $r_b$ is substantially not affected by the operating conditions such as the emitter and collector voltages or the emitter and collector currents. It is believed that the value of $r_b$ depends essentially on the bulk resistivity of the semi-conducting material. Furthermore, it depends on the spacing between the rectifying electrodes but will remain substantially constant when this spacing becomes larger than approximately 10 mils.

The physical effect which the pulsing treatment of the semi-conductor device produces is not known at the present time. However, it is believed that the comparatively large electrical charge applied between the collector and base electrodes breaks down the barrier layer of the crystal. Consequently, $r_c$ as well as $R_{22}$ is decreased. Furthermore, it is believed that the pulsing improves the collector's ability to collect holes.

In order to explain more fully the changes of the electrical characteristics of the semi-conductor device of the invention, reference is now made to Tables I and II below:

*Table I*

| Semi-conductor device | $R_{11}$ in ohms | $R_{21}$ in ohms | $R_{12}$ in ohms | $R_{22}$ in ohms | A | Power gain in db | |
|---|---|---|---|---|---|---|---|
| | | | | | | Measured | Calculated |
| 2-49A11 | 300 | 8,000 | 10 | 500 | 17.0 | 22.0 | 20.8 |
| 6-49A11 | 200 | 25,000 | 30 | 9,000 | 3.4 | 21.0 | 21.0 |
| 8-49A11 | 360 | 32,000 | 50 | 14,000 | 2.2 | 17.8 | 16.8 |
| 12-49A11 | 300 | 34,000 | 40 | 8,000 | 3.8 | 21.0 | 19.8 |
| 1X | 160 | 12,000 | 20 | 2,500 | 6.0 | 22.6 | 21.5 |
| 2X | 800 | 50,000 | 20 | 9,000 | 5.4 | 18.0 | 19.1 |
| 3X | 860 | 42,000 | 50 | 9,000 | 4.7 | 24.0 | 22.0 |
| 2A | 190 | 36,000 | 10 | 9,500 | 3.6 | 23.0 | 22.0 |
| 3 | 360 | 24,000 | 20 | 5,000 | 3.5 | 19.0 | 17.0 |
| 10 | 400 | 10,000 | 100 | 8,000 | 4.7 | 23.0 | 20.3 |
| 28-119 | 740 | 42,000 | 30 | 5,000 | 6.2 | 20.8 | 18.2 |
| 28-122 | 130 | 34,000 | 10 | 16,000 | 2.2 | 21.0 | 21.7 |
| Average | 400 | 29,100 | 32 | 7,500 | 5.2 | 21.1 | 20.0 |

*Table II*

| Semi-conductor device | $R_{11}$ in ohms | $R_{21}$ in ohms | $R_{12}$ in ohms | $R_{22}$ in ohms | A | Power gain in db | |
|---|---|---|---|---|---|---|---|
| | | | | | | Measured | Calculated |
| 50A4-2 | 440 | 60,000 | 220 | 35,000 | 2.2 | 31.0 | 19.4 |
| 50A4-16 | 320 | 42,000 | 80 | 14,000 | 2.8 | 22.8 | 19.3 |
| 49A93-16 | 160 | 30,000 | 30 | 16,000 | 2.1 | 22.0 | 20.4 |
| 50A4-28 | 360 | 45,000 | 60 | 14,000 | 3.4 | 28.4 | 20.5 |
| 49A93-27 | 440 | 60,000 | 180 | 22,000 | 2.8 | 27.8 | 19.9 |
| 49A93-29 | 180 | 44,000 | 50 | 21,000 | 2.2 | 23.8 | 21.5 |
| 49A93-32 | 320 | 44,000 | 100 | 23,000 | 1.8 | 18.8 | 17.6 |
| 49A93-34 | 440 | 65,000 | 10 | 10,000 | 7.0 | 28.2 | 24.2 |
| 49A93-16 | 180 | 40,000 | 10 | 14,000 | 2.6 | 23.2 | 21.0 |
| 49A93-27 | 240 | 47,000 | 60 | 14,000 | 3.0 | 22.0 | 21.0 |
| 50A4-8 | 360 | 60,000 | 180 | 30,000 | 1.9 | 27.0 | 18.7 |
| 50A4-23 | 360 | 45,000 | 60 | 14,000 | 3.2 | 23.5 | 19.6 |
| Average | 331 | 56,500 | 84 | 18,900 | 2.9 | 24.8 | 20.3 |

Table I lists the resistances $R_{11}$, $R_{21}$, $R_{12}$ and $R_{22}$ as well as the current gain A. The first column identifies the twelve different devices for which the values are given. The last two columns show the power gain in db as measured and as calculated. The calculated power gain was obtained from the formula given hereinabove. The twelve devices listed in Table I have been treated as described in connection with Figure 2. Table II lists the same properties for another group of twelve semi-conductor devices. However, the devices of Table II have been pulsed with a spacing between the rectifying electrodes of approximately two mils.

A comparison of Tables I and II will show that the average transfer resistance $R_{21}$ of the devices of Table I is approximately one half as large as that of the devices of Table II. The average equivalent base resistance $R_{12}$ and the average equivalent collector resistance $R_{22}$ of the devices of Table I have been reduced to less than one half the average values of the devices listed in Table II. On the other hand, the average current gain of the devices of Table I is almost twice as large as that of the devices of Table II. Consequently, the calculated power gains of the devices of Tables I and II are substantially the same. It will also be noted that the measured power gains of the devices shown in Table II are considerably higher than their calculated power gains. This is due to the higher internal feedback as evidenced by the higher values for $R_{12}$, the equivalent base resistance. Thus, in spite of the decrease of $R_{22}$ of the devices listed in Table I their gain remains constant because the current gain squared enters the gain formula while the gain is directly proportional to $R_{22}$.

Reference is now made to the following Table III:

*Table III*

| Crystal | $R_{11}$ in ohms | $R_{21}$ in ohms | $R_{12}$ in ohms | $R_{22}$ in ohms | Current gain A | Power gain in db | | Spacing between rectifying electrodes |
|---|---|---|---|---|---|---|---|---|
| | | | | | | Measured | Calculated | *Inches* |
| No. 1 | 440 | 125,000 | 200 | 45,000 | 2.5 | 28.8 | 22.0 | 0.002 |
| | 140 | 42,000 | 10 | 4,000 | 10.0 | 27.8 | 28.5 | .015 |
| No. 2 | 520 | 45,000 | 320 | 20,000 | 2.5 | 24.0 | 17.8 | .002 |
| | 560 | 30,000 | 10 | 2,500 | 14.0 | 23.8 | 23.4 | .015 |
| No. 3 | 320 | 60,000 | 160 | 25,000 | 2.5 | 26.9 | 20.8 | .002 |
| | 500 | 42,000 | 10 | 1,000 | 26.0 | 25.2 | 25.3 | .015 |

Table III gives a comparison of three different crystals. Each of the crystals was measured first with narrow spacing and narrow pulsing of the rectifying electrodes and then with wide spacing and wide pulsing of the electrodes. Table III again shows clearly the difference between the equivalent resistances, the current gain and the power gain for different electrical treatment. The wide variation between the measured and calculated power gain of the narrow spaced devices is quite noticeable. This is again proof of the large instability and of the larger internal feedback of the narrow spaced or conventional semi-conductor device.

Reference is now made to the following Table IV.

*Table IV*

| Semi-conductor device | $E_e$ volts | $I_e$ ma. | $R_i$ ohms | $E_c$ volts | $I_c$ ma. | $R_0$ ohms | Power gain, db | Stability during test | Wave form |
|---|---|---|---|---|---|---|---|---|---|
| 28-49A122 | 0.65 | 1.2 | 500 | 35 | 3.8 | 10K | 22.2 | Good | Good. |
| | .65 | 1.2 | 500 | 35 | 3.8 | 10K | 21.5 | do | Do. |
| 28-49A119 | .65 | .56 | 500 | 35 | 2.8 | 10K | 22.0 | do | Do. |
| | .65 | .55 | 500 | 35 | 2.8 | 10K | 21.2 | do | Do. |
| 34-49A119 | .30 | .36 | 500 | 25 | 4.1 | 10K | 20.0 | do | Do. |
| | .31 | .33 | 500 | 25 | 4.1 | 10K | 17.2 | do | Do. |
| 6A | .65 | .62 | 500 | 25 | 3.0 | 10K | 19.8 | do | Do. |
| | .55 | .72 | 500 | 25 | 3.0 | 10K | 18.2 | do | Do. |
| 7A | .45 | .6 | 500 | 20 | 4.6 | 2K | 17.0 | do | Do. |
| | .55 | .6 | 500 | 20 | 4.6 | 2K | 16.3 | do | Do. |

In Table IV the emitter voltage $E_e$, the emitter current $I_e$, the resistance $R_i$ (see Figure 2), the collector voltage $E_c$, the collector current $I_c$ and the resistance $R_0$ (see Figure 2) have been shown. Furthermore, the power gain, the stability of the device during the test and the wave form are shown. The first column identifies five different devices. The first row for each device indicates the measured values at a certain date while the second row indicates the same values measured after a period of 66 days. It will be seen that the change of the operating characteristics is extremely small. Also, the power gain decreases very little. This stability over a period of 66 days is appreciably better than that of conventional semi-conductor devices. The devices listed in Table IV were selected and not all devices exhibit the same stability over a long period of time.

It may also be pointed out that a device in accordance with the invention has been used successfully in a relaxation oscillator. In a test operation, the oscillator was turned on every morning and turned off at night and no adjustments of the circuit impedances of the supply voltages or current were required over a test period of several weeks. The relaxation oscillator used for this test is of the type disclosed and claimed in a copending application to E. Eberhard, Serial No. 70,661, filed on January 4, 1949, and assigned to the assignee of this application.

It will accordingly be seen that the semi-conductor device as disclosed in connection with Figure 2 has a low internal feedback and a very high current gain. Because of its frequency response range, it is particularly suitable for audio applications and for low speed counters. The current gain however is found to decrease at frequencies above 50 kilocycles (kc.). Three semi-conductor devices had a current gain at 25 kc. that ranged between 2.35 and 4.25. The current gain of 17 devices at 1 kc. ranged between 1.6 and 6.0. As will be seen in particular from Table I the equivalent base resistance is in all cases no more than 100 ohms and preferably should be below 50 ohms.

It will also be observed from Table II that some of the devices have a very low value of the equivalent base resistance $R_{12}$. In spite of their low equivalent base resistance, however, they still have an appreciable internal feedback as evidenced by the higher measured power gain compared to the calculated power gain. These devices have a bulk resistivity which is too low and they are difficult to manufacture.

Another semi-conductor device in accordance with the present invention will now be described in connection with Figure 4. This device also has high current gain, low internal feedback and low equivalent base resistance. Furthermore, this device has an excellent high frequency response which is comparable to that of conventional semi-conductor devices.

The semi-conductor device of Figure 4 includes semi-conducting body 10. Body 10 should consist of a low bulk resistivity material as defined hereinabove. The device is further provided with base electrode 11, emitter electrode 13, collector electrode 14, and with an auxiliary or pulsing electrode 60. In accordance with the present invention, pulsing electrode 60 is a rectifying electrode and may be a point electrode as shown; its distance from collector electrode 14 should be not less than 10 mils and preferably approximately 15 mils. On the other hand, the distance between collector electrode 14 and emitter electrode 13 should be no more than 5 mils and preferably approximately 2 mils.

The circuit of Figure 4 shows how the device may be electrically treated. To this end, base electrode 11 is grounded while collector electrode 14 is grounded through resistor $R_0$ and battery 27. Capacitor 31 may be charged by battery 33 when switch 32 is turned to the left. After the capacitor has been charged, it may be discharged between collector electrode 14 and base electrode 11 by throwing switch 32 in the other direction. Auxiliary electrode 60 now serves as an auxiliary emitter electrode. It is biased by battery 61 having its negative terminal grounded. The positive terminal of battery 61 is connected through resistor 62 and switch 63 to auxiliary electrode 60. Switch 60 is a single-pole double-throw switch arranged for connecting or disconnecting the battery 61 to auxiliary electrode 60. Emitter electrode 13 may be connected by switch 64 to resistor $R_i$ and battery 28.

The device is now treated in the manner previously disclosed. Switches 63 and 64 have the positions shown in Figure 4. Hence, emitter electrode 13 is disconnected while auxiliary electrode 60 is connected in the circuit. After the electrical treatment is completed, switch 63 is opened while switch 64 may be closed. The device is now ready for use. Auxiliary electrode 60 is not connected in the circuit and may even be removed. Emitter electrode 13 serves its normal purpose and an input signal may, for example, be impressed on resistor $R_i$ while the amplified output signal may be derived from resistor $R_0$.

The device of Figure 4 may take the form shown in Figure 1 having an additional auxiliary electrode and an additional conducting support therefor similar to supports 17 or 18. The device may be electrically treated after it has been assembled. The auxiliary electrode 60 is then disconnected, for example, by cutting off its support at the base of cylinder 22. Alternatively, it is feasible to move auxiliary electrode 60 after the pulsing has taken place. In that case, the distance between collector electrode 14 and auxiliary electrode 60 should be no more than 5 mils and emitter electrode 13 may be dispensed with because auxiliary electrode 60 now serves as emitter.

A semi-conductor device formed as explained in connection with Figure 4 has a high current gain and a low internal feedback. Furthermore, its equivalent base resistance is less than 70 ohms. Its frequency response is excellent for frequencies below 1 mc. (megacycles) and it may be used at frequencies up to 3 mc. However, the semi-conducting material used for this device can not have a high bulk resistivity because in that case the equivalent base resistance would be too high.

There have thus been disclosed improved semi-conductor devices. The devices are formed electrically by impressing a charge between the collector electrode and the base electrode in the reverse direction. At the same time, a steady current is permitted to flow between the collector electrode, the base electrode and an emitter or auxiliary electrode while the distance between the collector electrode and the emitter or auxiliary electrode is no less than 10 mils. The resulting device has high current gain, low internal feedback, high power gain and low equivalent base resistance. Its frequency response may be considerably improved by operating the device after it has been electrically treated with a distance between collector and emitter electrodes of no more than 5 mils.

What is claimed is:

1. A semi-conductor device comprising a semi-conducting body, a base electrode, an emitter electrode, a collector electrode, said electrodes being in contact with said body, said device being electrically treated by passing a short and intense pulse of current in the reverse direction between said collector and base electrodes under a condition of steady current flow in the reverse direction between said collector and base electrodes and in the forward direction between said emitter and base electrodes and with said emitter and collector electrodes spaced from each other no less than 10 mils, whereby the internal feedback of said device becomes negligible and its current gain is increased.

2. A device as defined in claim 1 wherein said emitter and collector electrodes are spaced from each other approximately 15 mils.

3. A semi-conductor device comprising a semi-conducting body, said body consisting of a semi-conducting material having a high bulk resistivity, a base electrode, an emitter electrode, a collector electrode, said electrodes being in contact with said body, said device being electrically treated by passing an electrical charge in the reverse direction between said collector and base electrodes under a condition of steady current in the reverse direction between said collector and base electrodes and in the forward direction between said emitter and base electrodes and with said emitter and collector electrodes spaced from each other no less than 10 mils, whereby the internal feedback of said device becomes negligible and its current gain is increased.

4. A semi-conductor device comprising a semi-conducting body, said body consisting of a body having a low bulk resistivity, a base electrode, an emitter electrode, a collector electrode, said electrodes being in contact with said body, said device being electrically treated by passing an electrical charge in the reverse direction between said collector and base electrodes under a condition of steady current flow in the reverse direction between said collector and base electrodes and in the forward direction between said emitter and base electrodes and with said emitter and collector electrodes spaced from each other no less than 10 mils, whereby the internal feedback of said device becomes negligible and its current gain is increased.

5. A semi-conductor device comprising a semi-conducting body, said body consisting of a low bulk resistivity material, a base electrode, an emitter electrode, a collector electrode, said electrodes being in contact with said body, said device being electrically treated by passing an electrical charge in the reverse direction between said collector and base electrodes under a condition of steady current flow in the reverse direction between said collector and base electrodes and in the forward direction between said emitter and base electrodes and with said emitter and collector electrodes spaced from each other no less than 10 mils, said emitter electrode being then moved toward said collector electrode so that their spacing is no more than 5 mils, whereby the internal feedback of said device becomes negligible and its current gain is increased.

6. A semi-conductor device comprising a semi-conducting body, a base electrode, an emitter electrode, a collector electrode, an auxiliary electrode, said electrodes being in contact with said body, said body consisting of a semi-conducting material having a low bulk resistivity, said auxiliary electrode being spaced from said collector electrode by a distance of the order of 10 mils or more, said emitter electrode being spaced from said collector electrode by a distance which is less than the first named distance, said device being electrically treated by impressing an electrical charge in the reverse direction between said collector and base electrodes while a steady current is permitted to flow in the reverse direction between said collector and base electrodes and in the forward direction between said auxiliary electrode and said base electrode, thereby to provide an equivalent base resistance of predetermined relatively low value when measured in circuit with said base electrode, said collector electrode and said emitter electrode.

7. A semi-conductor device comprising a semi-conducting body, a base electrode, an emitter electrode, a collector electrode, an auxiliary electrode, said electrodes being in contact with said body, said body consisting of a semi-conducting material having a low bulk resistivity, said auxiliary electrode being spaced from said collector electrode by a distance of approximately 15 mils, said emitter electrode being spaced from said collector electrode by a distance of not more than 5 mils, said device being electrically treated by impressing an electrical charge in the reverse direction between said collector and base electrodes while a steady current is permitted to flow in the reverse direction between said collector and base electrodes and in the forward direction between said auxiliary electrode and said base electrode, said emitter electrode being adapted to provide an amplifier or oscillator with said base and collector electrodes.

8. A semi-conductor device comprising a semi-conducting body, a base electrode, an emitter electrode, a collector electrode, an auxiliary electrode, said electrodes being in contact with said body, said body consisting of a semi-conducting material having a low bulk resistivity, said auxiliary electrode being spaced from said collector electrode by a distance of not less than 10 mils, said emitter electrode being spaced from said collector electrode by a distance of approximately 2 mils, said device being electrically treated by impressing an electrical charge in the reverse direction between said collector and base electrodes while a steady current is permitted to flow in the reverse direction between said collector and base electrodes and in the forward direction between said auxiliary electrode and said base electrode, thereby to provide an equivalent base resistance of the order of 70 ohms or less when measured in circuit with said base electrode, said collector electrode and said emitter electrode.

9. A semi-conductor device comprising a semi-conducting body, a base electrode, an emitter electrode, a collector electrode, an auxiliary electrode, said electrodes being in contact with said body, said body consisting of a semi-conducting material having a low bulk resistivity, said auxiliary electrode being spaced from said collector electrode by a distance of approximately 15 mils, said emitter electrode being spaced from said collector electrode by a distance of approximately 2 mils, said device being electrically treated by impressing an electrical charge in the reverse direction between said collector and base electrodes while a steady current is permitted to flow in the reverse direction between said collector and base electrodes and in the forward direction between said auxiliary electrode and said base electrode, thereby to provide an equivalent base resistance of the order of 70 ohms or less when measured in circuit with said base electrode, said collector electrode and said emitter electrode.

10. The method of preparing a semi-conducting device including a semi-conducting body, a base electrode in contact with said body, an emitter and a collector electrode, said method comprising the steps of positioning said emitter and collector electrodes in contact with said body at a distance of not less than 10 mils from each other, applying a steady electrical current in the reverse direction between said collector and base electrodes and in the forward direction between said emitter and base electrodes, and simultaneously impressing a short and intense pulse of current in the reverse direction between said collector and base electrodes.

11. The method of preparing a semi-conductor device including a semi-conducting body, a base electrode in contact with said body, an emitter and a collector electrode, said method comprising the steps of positioning said emitter and collector electrodes in contact with said body at a distance of approximately 15 mils from each other, causing a steady electrical current to flow in the reverse direction between said collector and base electrodes and in the forward direction between said emitter and base electrodes and simultaneously impressing a short and intense pulse of current in the reverse direction between said collector and base electrodes.

12. The method of preparing a semi-conductor device including a semi-conducting body of low bulk resistivity, a base electrode in contact with said body, an emitter and a collector electrode, said method comprising the steps of positioning said emitter and collector electrodes in contact with said body at a distance of not less than 10 mils from each other, causing a steady current to flow in the reverse direction between said collector and base electrodes and in the forward direction between said emitter and base electrodes and simultaneously impressing an electrical charge in the reverse direction between said collector and base electrodes while said emitter electrode is spaced therefrom by said distance, interrupting said current flow, and moving said emitter electrode towards said collector electrode and into contact with said body at a distance of the order of 5 mils or less from said collector electrode for final operation of said device in electrical circuits.

13. The method of preparing a semi-conductor device including a semi-conducting body, a base electrode in contact with said body, an emitter electrode, a collector electrode and an auxiliary electrode, said method comprising the steps of positioning said auxiliary electrode and said collector electrode in contact with said body at a distance of not less than 10 mils from each other, causing a steady current to flow in the reverse direction between said collector and base electrodes and in the forward direction between said auxiliary electrode and said base electrode and simultaneously impressing an electrical charge in the reverse direction between said collector and base electrodes, and positioning said emitter electrode in contact with said body at a distance from said collector electrode not more than 5 mils, whereby said device is adapted to be utilized with said base electrode, said collector electrode and said emitter electrode.

14. The method of preparing a semi-conductor device including a semi-conducting body of low bulk resistivity, a base electrode in contact with said body, an emitter electrode, a collector electrode and an auxiliary electrode, said method comprising the steps of positioning said auxiliary electrode and said collector electrode in contact with said body at a distance of approximately 15 mils from each other, causing a steady current to flow in the reverse direction between said collector and base electrodes and in the forward direction between said auxiliary electrode and said base electrode and simultaneously impressing an electrical charge in the reverse direction between said collector and base electrodes, and positioning said emitter electrode in contact with said body at a distance from said collector electrode of approximately 5 mils, whereby said device is adapted to be used in electrical circuits with said base electrode, said collector electrode and said emitter electrode.

15. A semiconductor device comprising a semi-conducting body, said body consisting of a semi-conducting material having a high bulk resistivity in the range of 10 to 20 ohm-centimeter, a base electrode, an emitter electrode, a collector electrode, said electrodes being in contact with said body, said device being electrically treated by passing an electrical charge in the reverse direction between said collector and base electrodes under a condition of steady current in the reverse direction between said collector and base electrodes and in the forward direction between said emitter and base electrodes and with said emitter and collector electrodes spaced from each other no less than 10 mils, whereby the internal feedback of said device becomes negligible and its current gain is increased.

16. A semiconductor device comprising a semiconducting body, said body consisting of a body having a low bulk resistivity in the range of 2 to 8 ohm-centimeter, a base electrode, an emitter electrode, a collector electrode, said electrodes being in contact with said body, said device being electrically treated by passing an electrical charge in the reverse direction between said collector and base electrodes under a condition of steady current flow in the reverse direction between said collector and base electrodes and in the forward direction between said emitter and base electrodes and with said emitter and collector electrodes spaced from each other no less than 10 mils, whereby the internal feedback of said device becomes negligible and its current gain is increased.

17. A semiconducting device comprising a semiconducting body, said body consisting of a low bulk resistivity material having a resistivity in the range of 2 to 8 ohm-centimeter, a base electrode, an emitter electrode, a collector electrode, said electrodes being in contact with said body, said device being in contact with said body, said device being electrically treated by passing an electrical charge in the reverse direction between said collector and base electrodes under a condition of steady current flow in the reverse direction between said collector and base electrodes and in the forward direction between said emitter and base electrodes and with said emitter and collector electrodes spaced from each other no less than 10 mils, said emitter electrode being then moved toward said collector electrode so that their spacing is no more than 5 mils, whereby the internal feedback of said device becomes negligible and its current gain is increased.

18. A semiconductor device comprising a semiconducting body, a base electrode, an emitter electrode, a collector electrode, an auxiliary electrode, said electrodes being in contact with said body, said body consisting of a semiconducting material having a low bulk resistivity in the range of 2 to 8 ohm-centimeter, said auxiliary electrode being spaced from said collector electrode by a distance of the order of 10 mils or more, said emitter electrode being spaced from said collector electrode by a distance which is less than the first named distance, said device being electrically treated by impressing an electrical charge in the reverse direction between said collector and base electrodes while a steady current is permitted to flow in the reverse direction between said collector and base electrodes and in the forward direction between said auxiliary electrode and said base electrode, thereby to provide an equivalent base resistance of predetermined relatively low value when measured in circuit with said base electrode, said collector electrode and said emitter electrode.

BERNARD N. SLADE.

References Cited in the file of this patent

UNITED STATES PATENTS

| Number | Name | Date |
| --- | --- | --- |
| 2,502,479 | Pearson et al. | Apr. 4, 1950 |
| 2,524,033 | Bardeen | Oct. 3, 1950 |
| 2,524,035 | Bardeen et al. | Oct. 3, 1950 |
| 2,563,503 | Wallace | Aug. 7, 1951 |
| 2,577,803 | Pfann | Dec. 11, 1951 |